(12) United States Patent
Sridharan et al.

(10) Patent No.: US 11,923,864 B2
(45) Date of Patent: Mar. 5, 2024

(54) FAST SWITCHING OF OUTPUT FREQUENCY OF A PHASE LOCKED LOOP (PLL)

(71) Applicant: Shaoxing Yuanfang Semiconductor Co., Ltd., Shaoxing (CN)

(72) Inventors: Srinath Sridharan, Bangalore (IN); Ankit Seedher, Bangalore (IN); Raja Prabhu J, Bangalore (IN); Purva Choudhary, Bangalore (IN); Sandeep Sasi, Bangalore (IN); Akash Gupta, Bangalore (IN); Jeevabharathi G, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 0 days.

(21) Appl. No.: 17/806,736

(22) Filed: Jun. 14, 2022

(65) Prior Publication Data
US 2023/0122081 A1    Apr. 20, 2023

(30) Foreign Application Priority Data
Oct. 18, 2021  (IN) ............................. 202141047239

(51) Int. Cl.
*H03L 7/197* (2006.01)
*H03L 7/087* (2006.01)
*H03L 7/099* (2006.01)

(52) U.S. Cl.
CPC ............ *H03L 7/1976* (2013.01); *H03L 7/087* (2013.01); *H03L 7/099* (2013.01)

(58) Field of Classification Search
CPC ................ H03L 7/07; H03L 7/06; H03L 7/00
See application file for complete search history.

(56) References Cited

U.S. PATENT DOCUMENTS

| 5,207,491 A | 5/1993 | Rottinghaus |
|---|---|---|
| 5,638,410 A | 6/1997 | Kuddes |

(Continued)

FOREIGN PATENT DOCUMENTS

| EP | 0315489 A2 | 5/1989 |
|---|---|---|
| JP | 2000278126 A | 10/2000 |
| WO | WO2017189160 A1 | 9/2016 |

OTHER PUBLICATIONS

Si5345/44/42 Rev D Data Sheet, http://www.mouser.com/ds/2/368/Si5345-44-42-D-DataSheet-968622.pdf, downloaded circa Sep. 12, 2017, 61 pages.

(Continued)

*Primary Examiner* — Diana J. Cheng
(74) *Attorney, Agent, or Firm* — IPHORIZONS PLLC; Narendra Reddy Thappeta

(57) ABSTRACT

A phase-locked loop (PLL) is implemented to have another (second) PLL in place of the controlled oscillator. When a known frequency change in the frequency of the output clock is desired, in addition to changing a configuration of the PLL (first PLL), the configuration of the second PLL is also changed to cause the frequency of the output clock to change quickly. In various embodiments, the configuration of the second PLL is changed by changing the divisor of the feedback divider of the second PLL, the divisor in a prescaler in the second PLL, the control voltage of a VCO used in the second PLL, and any other point of user control in the second PLL.

14 Claims, 3 Drawing Sheets

(56) References Cited

U.S. PATENT DOCUMENTS

| | | | |
|---|---|---|---|
| 5,648,964 | A | 7/1997 | Nagaki et al. |
| 5,740,211 | A | 4/1998 | Bedrosian |
| 6,144,674 | A | 11/2000 | Peres et al. |
| 6,362,670 | B1 | 3/2002 | Beaulieu |
| 6,366,146 | B2 | 4/2002 | Fredriksson |
| 6,570,454 | B2 | 5/2003 | Skierszkan |
| 6,664,827 | B2 | 12/2003 | O'Leary et al. |
| 6,741,109 | B1 | 5/2004 | Huang et al. |
| 6,806,751 | B2 | 10/2004 | Helfinstine |
| 7,126,432 | B2 | 10/2006 | Roubadia et al. |
| 7,369,002 | B2 | 5/2008 | Spijker et al. |
| 7,405,628 | B2 | 7/2008 | Hulfachor et al. |
| 7,719,368 | B1 | 5/2010 | Smith et al. |
| 7,893,736 | B2 | 2/2011 | Palmer et al. |
| 7,965,115 | B2 | 6/2011 | Jin |
| 8,509,370 | B2 | 8/2013 | Bhagavatheeswaran et al. |
| 9,007,105 | B2 | 4/2015 | Jenkins |
| 9,112,517 | B1 * | 8/2015 | Lye .................. H03L 7/185 |
| 9,362,924 | B1 | 6/2016 | Xu et al. |
| 9,602,113 | B2 | 3/2017 | Galton et al. |
| 9,628,094 | B2 | 4/2017 | Lotfy et al. |
| 10,158,364 | B1 | 12/2018 | Tsai et al. |
| 10,514,720 | B1 | 12/2019 | J et al. |
| 10,644,869 | B2 | 5/2020 | Tsai et al. |
| 10,965,295 | B1 * | 3/2021 | Hussien .................. H03L 7/23 |
| 2003/0133522 | A1 | 7/2003 | Staszewski et al. |
| 2007/0254600 | A1 | 11/2007 | Ishii |
| 2007/0285177 | A1 | 12/2007 | Werker |
| 2008/0002801 | A1 | 1/2008 | Droege et al. |
| 2022/0124655 | A1 * | 4/2022 | Liu .................. H04J 3/0685 |

OTHER PUBLICATIONS

82P33731 Datasheet, https://www.idt.com/document/dst/82p33731-datasheet, downloaded circa Sep. 13, 2017, 65 pages.

AD9547 Data Sheet, Dual/Quad Input Network Clock Generator/Synchronizer, http://www.analog.com/media/en/technical-documentation/data-sheets/AD9547.pdf, downloaded circa Sep. 19, 2017, 61 pages.

Snaa208 Using the LMK0480x/LMK04906 for Hitless Switching and Holdover, http://www.ti.com/lit/an/snaa208/snaa208.pdf, date Jul. 12, 2013, 13 pages.

CS8525 LC/P Line Card Protection Switch for SONET/SDH Systems, http://www.semtech.com/images/datasheet/acs8525.pdf, downloaded circa Sep. 8, 2017, 65 pages.

Slobodan Milijevic, The basics of synchronized Ethernet, Data Transmission, date Apr. 21, 2009, 04 pages.

D.C. Wei, et al., A monolithic low-bandwidth jitter-cleaning PLL with hitless switching for SONET/SDH clock generation, 2006 IEEE International Solid State Circuits Conference—Digest of Technical Papers, Date of Conference: Feb. 6-9, 2006, 2 pages.

Max 10 Clocking and PLL User Guide, https://www.intel.com/content/dam/www/programmable/us/en/pdfs/literature/hb/max-10/archives/ug-m10-clkpll-15.1.pdf, Nov. 2, 2015, 72 Pages.

Sheng Ye, et al, A Multiple-Crystal Interface PLL with VCO Realignment to Reduce Phase Noise, 2002 IEEE International Solid-State Circuits Conference. Digest of Technical Papers, Date of Conference: Feb. 7-7, 2002, 03 Pages, IEEE, San Francisco, CA, USA.

Liang Wang, et al, A Novel Phase-Locked Loop Based on Frequency Detector and Initial Phase Angle Detector, IEEE Transactions on Power Electronics ( vol. 28, Issue: 10, Oct. 2013), Date of Publication: Dec. 28, 2012, 11 Pages, IEEE.

Dramatically Improve Your Lock Time with VCO Instant Calibration, https://www.ti.com/lit/an/snaa342/snaa342.pdf?ts=1637913867099&ref_url=https%253A%252F%252Fwww.google.com%252F, Sep. 2020, 12 Pages.

Streamline RF Synthesizer VCO Calibration and OptimizePLL Lock Time, https://www.ti.com/lit/an/snaa336a/snaa336a.pdf?ts=1637914131915&ref_url=https%253A%252F%252Fwww.google.com%252F, Jan. 2020, 18 pages.

Hae-Soo Jeon, et al, Fast Frequency Acquisition All-Digital PLL Using PVT Calibration, 2008 IEEE International Symposium on Circuits and Systems (ISCAS), Date of Conference: May 18-21, 2008, pp. 2625-2628, IEEE, Seattle, WA, USA.

\* cited by examiner

FAST SWITCHING OF OUTPUT FREQUENCY OF A PHASE LOCKED LOOP (PLL)

PRIORITY CLAIM

The instant patent application is related to and claims priority from the co-pending India provisional patent application entitled, "Fast Frequency-Change in PLLs", Serial No.: 202141047239, Filed: 18 Oct. 2021, which is incorporated in its entirety herewith to the extent not inconsistent with the description herein.

BACKGROUND

Technical Field

Embodiments of the present disclosure relate generally to phase-locked loops (PLLs), and more specifically to fast switching of output frequency of a phase locked loop.

Related Art

Phase-locked loops (PLLs) are frequently used to generate clock signal(s). A PLL receives an input clock and generates an output clock (the clock signal) usually at a frequency (output frequency) that is a desired multiple of the frequency of the input clocks.

There are often situations when the output frequency of a PLL needs to be switched to a higher or lower frequency from a present frequency, typically in a steady state. There may be a need to effect such switching quickly. However, PLLs are often designed to have low bandwidth, for example, to reduce or avoid jitter in the output clock.

Aspects of the present disclosure are directed to fast switching of output frequency of PLLs.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A phase-locked loop (PLL) (referred to as first PLL) provided according to an aspect of the present disclosure uses a second PLL as a controlled oscillator of the first PLL. Due to the high bandwidth of the second PLL, frequency changes of output clock of first PLL can be effected quickly by changing the configuration of the second PLL in addition to changing the configuration of the first PLL. In one embodiment, changing the configuration of the first PLL entails setting a divisor of a feedback divider in the first PLL corresponding to the required frequency changes.

In an embodiment, changing the configuration of the second PLL entails changing the divisor of the feedback divider of the second PLL and/or that of the pre-scaler of the second PLL. In addition, the operation of the second PLL also can be further controlled by configuring the voltage input driving the output frequency of the second PLL.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
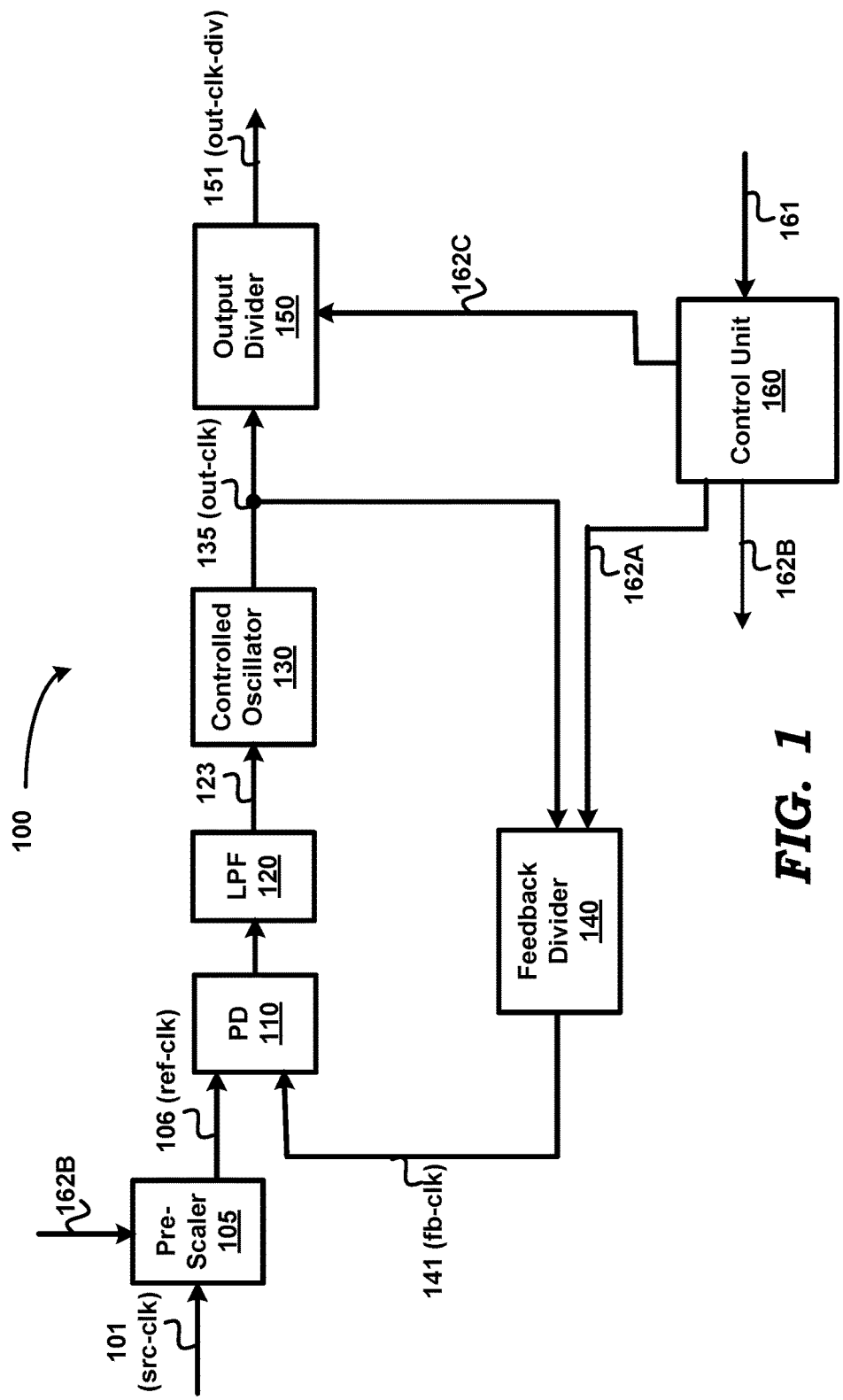
FIG. 1 is a block diagram of an example device in which several aspects of the present disclosure can be implemented.

FIG. 1 is a block diagram illustrating the details of an example component in which several aspects of the present disclosure can be implemented. PLL 100 is shown there containing pre-scaler 105, phase detector (PD) 110, low-pass filter (LPF) 120, controlled oscillator 130, feedback divider 140, output divider 150 and control unit 160. The components and blocks of FIG. 1 are shown merely by way of illustration. For example, when implemented using mostly analog components (such LPF 120 as an analog filter), PLL 100 may contain a charge pump between PD 110 and LPF 120. In alternative embodiments, PLL 100 may contain more, fewer or differently implemented blocks. For example, PLL 100 can be implemented as an all-digital PLL (ADPLL) with PD 110 implemented as a time-to-digital converter (TDC), a digital filter in place of LPF 135 and VCO 140 implemented as a digitally-controlled oscillator (DCO). PLL 100 may also be implemented with a combination of analog and digital blocks, as would be apparent to one skilled in the relevant arts. The description below is provided in the context of an ADPLL. However, several aspects of the present disclosure can be implemented with corresponding changes with other implementations of PLL 100.

Pre-scaler 105 represents a frequency divider and receives a source clock 101 (src-clk) from a clock source such as, for example, a crystal oscillator. Pre-scaler 105 also receives an input on path 162B from control unit 160. Pre-scaler 105 divides the frequency of src-clk by a value received on path 162 to generate reference clock 106 (ref-clk).

PD 110 receives ref-clk and feedback clock 141 (fb-clk), and generates an error signal representing the phase difference between reference clock 101 and feedback clock 141. The phase difference may be obtained based on the times of occurrences of the rising (or falling) edges of clocks 101 and 141. PD 110 may be implemented as a TDC, with the error signal being represented by digital values, as is well known in the relevant arts.

LPF 120, implemented as a digital filter receives the error signal generated by PD 110, and performs low-pass filtering of the error signal to generate a filtered error signal on path 123 in the form of digital values as an output. Although noted as being implemented as a digital filter, LPF 120 can be a fully analog implementation of a filter or a combination of analog and digital elements.

Controlled oscillator 130 receives the filtered error signal 123 and generates output clock 135 (out-clk) at a frequency determined by the strength (represented by the signed magnitude) of filtered error signal 123.

Feedback divider 140 represents a frequency divider and receives out-clk as an input. Feedback divider 140 divides the frequency of out-clk by a number (divisor) received on path 162A to generate fb-clk. Feedback divider 140 may be implemented as an integer-only divider or a fractional divider that can divide by fractions (a number of the form M.N, with M and N being integers and "." representing the decimal point. As is well known in the relevant arts, one way to implement a fractional divider is by using a delta sigma modulator (DSM) to generate a sequence of divisor values (all integers) so that the effective division by a dividing circuitry within feedback divider 140 is so as to divide out-clk by the desired fraction.

Output divider 150 is another frequency divider and divides the frequency of out-clk to generate a divided output clock 151 (out-clk-div).

Control unit 160 receives one or more user inputs on path 161 (which may represent a single path or multiple paths) from a user device (e.g., microprocessor system, general-purpose computer, etc.). Input 161 may be provided in a suitable format and specifies the desired frequency for out-clk and out_clk_div. Alternatively, input 161 may contain divisor values to be used by feedback divider 140, pre-scaler 105 and output divider 150. Accordingly, control unit 160 either forwards the divisor values to the respective dividers, or computes corresponding values (numbers) on paths 162A, 162B and 162C and forwards the values to feedback divider 140, pre-scaler 105 and output divider 150 such that out-clk and out-clk-div are generated with the desired frequencies. Control unit 160 may be implemented to have logic internally needed for deriving the divisor values from the user input 161. Alternatively, or additionally, control unit 160 may internally contain registers to store the divisor values provided by the user via path 161.

PLL 100 is typically implemented to have a very narrow bandwidth (for example, of the order of a few milli-Hertz to a few Hertz (Hz). Hence, LPF 120 may be implemented with a very narrow pass-band/bandwidth. Further, the gain provided by PD 110 and controlled oscillator 130 may be correspondingly small to minimize jitter in out-clk. Due to narrow bandwidth of PLL 100, any (large) change in frequency of out-clk therefore typically requires a substantially long time. An example environment in which a clock with very low jitter, i.e., a jitter attenuating PLL, is desired is described below with respect to FIG. 4.

As noted above, there are several environments in which a change to a known new frequency (from the current frequency) of out-clk (135) is required. For example, a very frequent requirement with respect to jitter attenuating PLLs is to perform a known frequency change in the frequency of the output clock 135. A user can initiate the change by providing the corresponding divisor value needed to effect the change in frequency to feedback divider 140 (or alternatively to pre-scaler 105 or both). However, the very low bandwidth of PLL 100 translates to a very large time before the new frequency reaches the desired value from the time the change is initiated. Such a change is commonly referred to as the overall PLL 100 being used in the Digitally Controlled Oscillator (DCO) mode of operation.

An aspect of the present disclosure enables a known frequency change in out-clk to be achieved very quickly, as described next.

3. Fast Frequency Change

According to an aspect of the present disclosure, controlled oscillator 130 is implemented as another (second) PLL, and affords many frequency modification points therein (i.e., in the second PLL) for fast frequency change of out-clk. To distinguish main PLL 100 from the second PLL, main PLL 100 may be viewed as the first PLL.

The bandwidth required of the second PLL does not need to be narrow and therefore can be very wide. Further, the BW of the second PLL may be substantially decoupled from (or independent of) the bandwidth (BW) of the first PLL. Therefore, by changing the parameters (configuration) of the high-BW second loop at one or more locations (as noted below) in addition to changing the divisor(s) of feedback divider 140 and/or pre-scaler 105, a fast change in frequency of out-clk can be achieved. Alternatively, or in addition, a frequency of the clock source in the first PLL can also be changed. In general, changes to the respective parameters of the first PLL as noted above may be viewed as a change in configuration of the first PLL.

Figure 2:
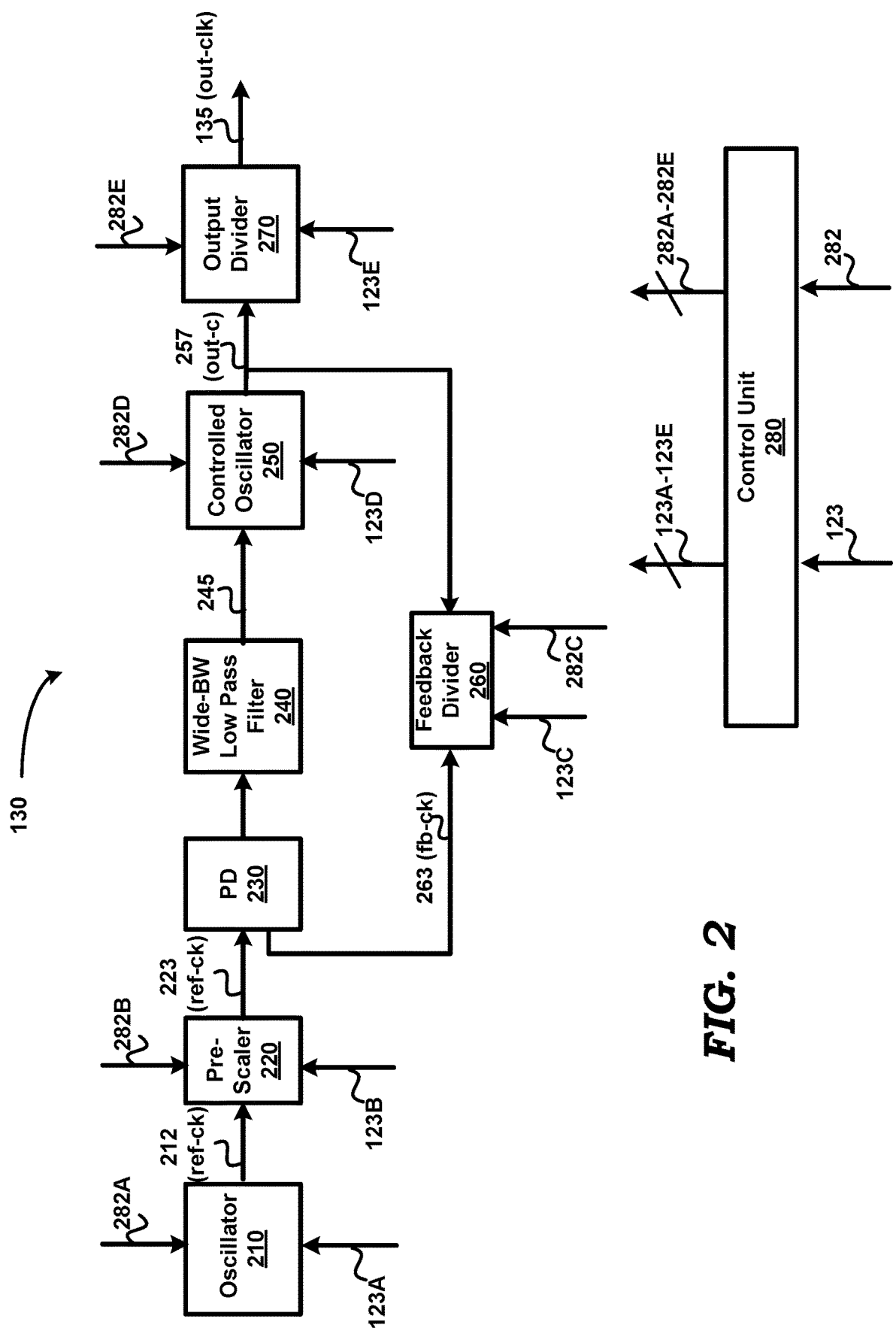
FIG. 2 is a block diagram of a second PLL (Phase Locked Loop) used in place of a controlled oscillator of a first PLL in an embodiment of the present disclosure.

FIG. 2 is a block diagram of the implementation of controlled oscillator 130 as another (second) PLL. The second PLL 130 is shown containing reference oscillator 210 (or 'source oscillator'), pre-scaler 220, PD 230, wide-BW LPF 240, controlled oscillator 250, feedback divider 260, output divider 270 and control unit 280. In some embodiments, wide-BW LPF 240 is not implemented at all thereby making the second PLL to have a very large bandwidth. Alternatively, LPF 240 is implemented with a BW that is significantly larger compared to (e.g, several times) the bandwidth of the first PLL. To distinguish between the corresponding blocks of the first and second PLLs that perform similar/same type of operations, such blocks are prefixed with the word "second" or "first" for quick reference.

Oscillator 210 generates a source clock src-ck as an output, and may be implemented using any oscillator design technique.

Second pre-scaler 220 represents a frequency divider and receives src-ck. Second pre-scaler 220 also receives an input on path 282B from control unit 280. Second pre-scaler 220 divides the frequency of src-ck by a value received on path 282B to generate reference clock 223 (ref-ck).

Second PD 230 receives ref-ck and feedback clock 263 (fb-ck), and generates an error signal representing the phase difference between ref-ck and fb-ck. The phase difference may be obtained based on the times of occurrences of the rising (or falling) edges of the respective clocks. Second PD 230 may be implemented as a TDC, with the error signal being represented by digital values.

Wide-band LPF 240 (second LPF), implemented as a digital filter, receives the error signal generated by second PD 230, and performs low-pass filtering of the error signal received from second PD 230 to generate a filtered error signal on path 245 in the form of digital values as an output. Alternatively, wide-band LPF 240 may be an analog filter that does frequency-selective filtering on input currents or voltages based on the architecture of the second PLL. Usually, a charge pump is additionally implemented at the output of PD 230, although such charge pump may be viewed as being implemented in either PD 230 or LPF 240 for sake of clarity in the diagram.

Second controlled oscillator 250 receives filtered error signal 245 and generates intermediate output clock 257 (out-c) at a frequency determined by the strength of filtered error signal 245.

Second output divider 270 is another frequency divider and divides the frequency of out-c (257) to generate out-clk (135), which is the output clock of PLL 100 of FIG. 1. In some embodiments, second output divider is not implemented, and the output of controlled oscillator 250 is itself the output clock out-clk 135 of PLL 100.

Second feedback divider 260 represents a frequency divider and receives out-c as an input. Second feedback divider 260 divides the frequency of out-c by a number (divisor) received on path 282A to generate feedback clock fb-ck 263. In the case of fractional division, second feedback divider may include a delta-sigma modulator (DSM) to receive the value on path 282A, and generates a sequence of divisor values to be used successively by the division circuitry in feedback divider 260, as is well known in the relevant arts. Feedback divider 260 may be implemented similar to first feedback divider 140, and the description is not repeated again in the interest of conciseness.

There are multiple ways by which the second PLL can be controlled (for example, via path 123, or via other paths in the first PLL). In other words, there are multiple ways in which the error value on path 123 can be propagated within second PLL to thereby control the second PLL to perform the operations needed of a controlled oscillator in a PLL. For example, in one embodiment, a voltage or current correction is applied to oscillator 210 on control path 123A. The voltage/current can be either a direct voltage/current or the output of a digital to analog converter (DAC) that works on the digital correction from the first PLL to convert it to a voltage or current on path 123A. In another embodiment, or additionally, the divide factor applied by pre-scaler 220 is set by the first PLL via control path 123B. In yet another embodiment, the divide factor used by the second PLL's feedback divider 260 is set by the first PLL via path 123C. It is noted here that a combination of two or more of the above-noted control techniques can be used instead of just one, as would be apparent to one skilled in the relevant arts. Further, the second PLL (130) can also be controlled by changing the division factor of output divider 270 or controlled oscillator 250 via respective paths 123E and 123D. It is also noted that any change to controlled oscillator 250 may be in addition to a corresponding change in feedback divider 260 and/or pre-scaler 220 and/or oscillator 210.

Thus, the second PLL can be controlled at one or more of the 'points of control'—oscillator 210, pre-scaler 220, controlled oscillator 250, output divider 270 and feedback divider 260—to effect a response to signal 123 of FIG. 1, with the respective control paths being represented by 123A-123E. Accordingly, the second PLL is shown as containing a control unit 280 that receives the value on path 123 of the first PLL. Control unit 280 is implemented to translate the value 123 to one or more corresponding values on control paths 123A-123E to effect the response.

Paths 282A-282E may be viewed as 'configuration paths' via which the second PLL may be configured for operation. For example, a user may provide on path 282 an input value specifying the initial value of output frequency 135. Control unit 280 may translate value 282 to one or more values on configuration paths 282A-282E to initialize the second PLL. Similarly, any desired change in the output frequency 135, i.e., a new output frequency 135, is specified by user inputs on paths 161 and 282. Control unit 280 may translate value 282 to one or more values on configuration paths 282A-282E to initialize the second PLL or to cause a change in the output frequency 135. It may be observed that one or more of the points of control can also be configuration points. Accordingly, each of the points of control may be implemented to contain an arithmetic unit, such as an adder, to add the pair of values that may be received on inputs 123X and 282X (X being one or A, B, C, D and E). The sum of the corresponding pair is then applied to the corresponding block, to cause PLL 100 to quickly change the output frequency 135 to a new value.

Control unit 280 may internally contain suitable digital logic and/or registers/memory for storing, computing and forwarding the corresponding values noted above. Additionally, control unit 280 may perform any format conversions prior to forwarding the corresponding values.

Thus, when a known frequency change is needed for the frequency of output clock out-clk 135 of PLL 100, the user provides values required to specify the change on paths 161 and 282. Respective control units 160 and 280 then generate corresponding values on one or more of respective sets of paths 162A-162C (and a path, not shown, to change frequency of clock source generating source clock 101) and 282A-282E to cause PLL 100 to effect the change.

The values needed to be provided on paths 161 and 282 may be pre-computed by the user since the new frequency is known a priori. Thus, the user may pre-compute the values 161 and 282 required for several known values of frequencies of output clock 135. The pre-computed values may be stored in either of control units 160 and 280.

Since the second PLL 130 has a wide bandwidth, PLL 130 can quickly switch to generating out-c 257 and therefore out-clk 135. When second output divider 270 is not implemented, the output of second controlled oscillator 250 is itself out-clk 135, as noted above. Depending on whether second output divider 270 is implemented or not, the divisor value to be provided to second feedback divider 260 may be different. However, since the user knows/controls the divisor used by second output divider 270, both the divisor values can be easily computed by the user.

Thus, by changing the corresponding 'configuration values' provided to first PLL and the second PLL, either simultaneously or with a slight time gap in either order, PLL 100 can achieve a fast change in the frequency of output clock out-clk 135.

Denoting f( ) as the frequency of a clock, the following relations illustrate how, in an example embodiment, the change in output frequency is achieved quickly by changing the divisor in the respective feedback dividers of the first and second PLL. For example, if the current value of the divisor used by output feedback divider 140 is k2, and if k2*Δ2 is the change required in k2 to change to the desired new frequency f(new-out-clk) of out-clk 135, then: f(new-out-clk)=k2*(1+Δ2)*f(ref-clk), wherein ref-clk is reference clock 106 of first PLL 100.

If the current value of the divisor used by second output feedback divider 260 is k1, then to achieve the frequency change to f(new-out-clk), the new output frequency desired in out-clk is also expressed by:

$$f(\text{new-out-clk})=k1*(1+\text{control}(t))*f(\text{ref-ck}); \text{ wherein ref-ck is the current frequency of reference clock } 223(\text{ref-ck}).$$

The change required in k1 is expressed by the function control(t). In the absence of any change to k1 directly by a user, control(t) represents the time-dependent correction that would occur normally due to the operation of the low bandwidth (and hence slow) main PLL loop 100.

However, according to aspects of the present disclosure, the user also changes the divisor k1 to k1*(1+Δ1), wherein Δ1 represents the change in k1 required for effecting the desired change in frequency of output clock out-clk. That is, the function control(t) is replaced by a change to k1. Since the second PLL 130 is very fast (high bandwidth), out-clk 135 is quickly changed to the new desired frequency.

It is noted here that instead of changing k1 of feedback divider 260, the fast change can also be achieved by changing the divisor of pre-scaler 220 via path 282B. Alternatively, both the divisors of pre-scaler 220 and feedback divider 260 can be changed by corresponding values. If oscillator 210 is implemented in a way that allows user adjustment of the frequency of its output ref-ck, then a corresponding adjustment to the oscillator 210 can also be done instead of, or in addition to, the other configuration changes noted above.

When controlled oscillator 250 is implemented as a voltage-controlled oscillator (VCO), digital values can be written to control inputs of the VCO via path 282D to change the value of capacitances of the tuned circuits used within the VCO. When controlled oscillator 250 is implemented as another PLL, then the corresponding divisor values, etc., can be changed in a similar manner. Any level of nesting of PLLs can be used in place of controlled oscillators 250 and 130. In general, any parameter or value that can be user-controlled in one or more blocks of the second PLL that enable a quick change in frequency of the output clock of PLL 100 can be changed, as would be apparent to one skilled in the relevant arts upon reading the disclosure herein.

The values of all of the configuration parameters (such as divisor values, etc.) of second PLL can be computed a priori in a known way by a user and saved in control unit 280, control unit 160 or a memory unit within PLL 100.

PLL 100 implemented as described above can be incorporated in a larger device or system as described briefly next.

4. System

Figure 3:
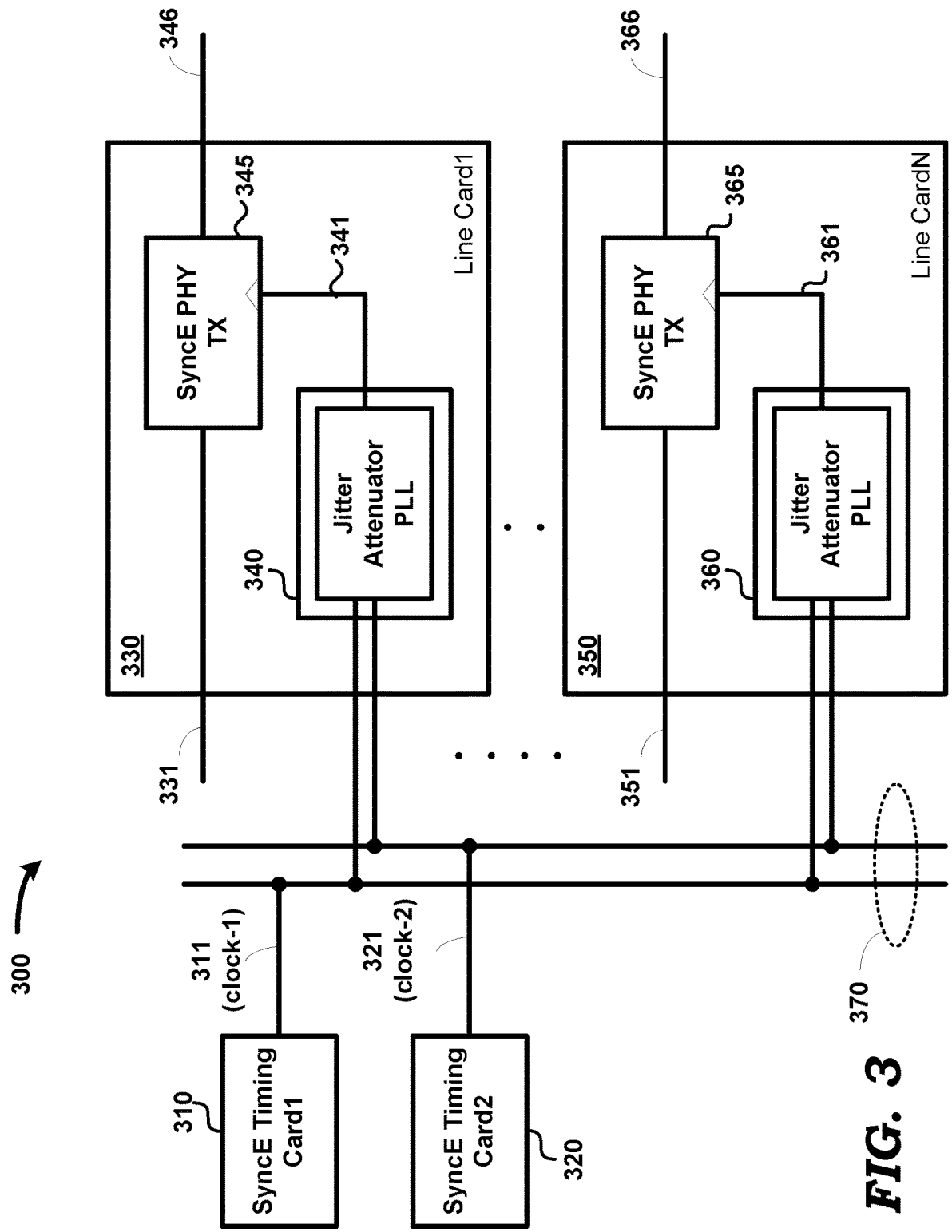
FIG. 3 is a block diagram of a system in which a device implemented according to several aspects of the present disclosure can be incorporated, in an embodiment of the present disclosure.

FIG. 3 is a block diagram of an example system containing a PLL implemented according to various aspects of the present disclosure, as described in detail above. System 300 is shown containing SyncE (Synchronous Ethernet) timing cards (310 and 320) and line cards 1 through N, of which only two line cards 330 and 350 are shown for simplicity. Line card 330 is shown containing jitter attenuator PLL 340 and SyncE PHY Transmitter 345. Line card 350 is shown containing jitter attenuator PLL 360 and SyncE PHY Transmitter 365. The components of FIG. 3 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 310 or 320). Accordingly, Ethernet packets are re-timed with respect to the master clock, and then transmitted in the physical layer. Thus, data packets (e.g., on path 331 and 351) are re-timed and transmitted without any time stamp information being recorded in the data packet. The packets may be generated by corresponding applications such as IPTV (Internet Protocol Television), VoIP (Voice over Internet Protocol), etc.

Thus, line card 330 receives a packet on path 331, and forwards the packet on output 346 after the packet has been re-timed (synchronized) with a master clock. Similarly, line card 350 receives a packet on path 351, and forwards the packet on output 366 after the packet has been re-timed (synchronized) with a master clock.

The master clock (311/clock 1) is generated by timing card 310. Timing card 320 generates a redundant clock (321/clock-2) that is to be used by line cards 330 and 350 upon failure of master clock 311. Master clock 311 and redundant clock 321 are provided via a backplane (represented by numeral 370) to each of lines cards 330 and 350.

In line card 330, jitter attenuator PLL 340 may be implemented as PLL 300 described above in detail, and receives clocks 311 and 321. PLL 340 generates an output clock 341 which is used to synchronize (re-time) packets received on path 331 and forwarded as re-timed packets on path 346. PLL 340 is implemented as described in detail above to enable fast frequency switching.

Similarly, in line card 350, jitter attenuator PLL 360 may also be implemented as PLL 300 described above in detail, and receives clocks 311 and 321. PLL 360 generates an output clock 361 which is used to synchronize (re-time) packets received on path 351 and forwarded as re-timed packets on path 366. PLL 360 is implemented as described in detail above to enable fast frequency switching.

5. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 2 and 3 although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A phase-locked loop (PLL) to generate an output clock locked to a first input clock at a frequency which is product of a first divisor and a frequency of said input clock in a normal mode of operation and to switch to a different frequency thereafter, wherein said different frequency is product of another divisor and said frequency of said input clock, said PLL comprising:

a first phase detector coupled to receive said first input clock on an input path and a feedback clock on a feedback path, said phase detector to generate an error signal representing a phase difference between said first input clock and said feedback clock;

a first low-pass filter with a first passband to generate a filtered error signal by filtering said error signal;

a first oscillator coupled to generate said output clock from said filtered error signal, wherein a frequency of said output clock is determined by a strength of said filtered error signal;

a first feedback divider to divide said output clock by said first divisor of a first value in said normal mode, wherein said first phase detector, said first low-pass filter, said first oscillator and said first feedback divider together operate as a first PLL having a first bandwidth in generating said output clock, wherein said first oscillator is implemented as a second PLL with a second bandwidth higher in magnitude compared to said first bandwidth, wherein said filtered error signal is provided as input signal to said second PLL and said second PLL provides said output clock, wherein said first bandwidth is designed to cause said PLL to settle to said different frequency in a first duration upon a corresponding configuration change of said first PLL, but not that of said second PLL; and a control unit to control operation of said first PLL and said second PLL, wherein to switch to said different frequency of said output clock said control unit changes, within an interval from each other less than said first duration, a configuration of each of said first PLL and said second PLL to generate said output clock at said different frequency, wherein changing said configuration of said first PLL comprises operating said first feedback divider based on said another divisor and/or changing said frequency of said input clock to effectively provide said output clock with said different frequency, wherein said output clock changes to operate at said different frequency in a second duration determined by said interval and the higher second bandwidth of said second PLL.

2. The PLL of claim 1, wherein said second PLL comprises:

a third oscillator to generate a second input clock with a first frequency;

a second phase detector to receive said second input clock divided by an integer greater than or equal to one, on a corresponding input path and a second feedback clock on a second feedback path, said phase detector to generate a second error signal representing a second phase difference between said second input clock and said second feedback clock;

a second oscillator to generate said output clock from said second error signal;

a second feedback divider to divide said output clock by a second divisor to generate said second feedback clock, wherein said changing configuration of said second PLL comprises changing said second divisor to a new value corresponding to said different frequency.

3. The PLL of claim 2, wherein said second divisor is a sum of said filtered error signal and a third divisor, wherein a user provided value for said third divisor causes said new value to be generated as said sum.

4. The PLL of claim 2, wherein said second PLL comprises:

a second pre-scaler to divide a third input clock by a pre-scaler divisor to generate a second input clock.

5. The PLL of claim 2, wherein said changing configuration of said second PLL further comprises forcing a voltage input to another new value corresponding to said different frequency, wherein said voltage input represents said second error signal.

6. The PLL of claim 2, wherein said second oscillator is implemented as a third PLL with a third bandwidth higher in magnitude compared to said second bandwidth, wherein said second PLL comprises a second low-pass-filter with a second passband to generate a second filtered error signal by filtering said second error signal, wherein said second oscillator generates said output clock based on said second filtered error signal, wherein said second filtered error signal is provided as an input signal to said third PLL and said third PLL provides said output clock, wherein to switch to said different frequency of said output clock, said control unit changes a configuration of each of said first PLL, said second PLL and said third PLL substantially simultaneously to generate said output clock at said different frequency.

7. The PLL of claim 1, wherein configurations of both said first PLL and said second PLL are changed simultaneously or with a slight time gap to correspondingly reduce said second duration.

8. A system comprising:

a line card coupled to receive a data packet, said line card to re-time said data packet with reference to a selected clock, and to transmit a re-timed packet; and a first timing card to generate a first clock, wherein said line card comprises a phase-locked loop (PLL) coupled to receive said first clock, said PLL to generate an output clock based on said first clock as said selected clock, said output clock locked to said input clock at a frequency which is product of a first divisor and a frequency of said input clock in a normal mode of operation and to switch to a different frequency thereafter, wherein said different frequency is product of another divisor and said frequency of said input clock, wherein said PLL comprises:

a first phase detector coupled to receive said first clock on an input path and a feedback clock on a feedback path, said phase detector to generate an error signal representing a phase difference between said first input clock and said feedback clock;

a first low-pass filter with a first passband to generate a filtered error signal by filtering said error signal;

a first oscillator coupled to generate said output clock from said filtered error signal, wherein a frequency of said output clock is determined by a strength of said filtered error signal;

a first feedback divider to divide said output clock by said first divisor of a first value in said normal mode, and by said a second value corresponding to said different frequency in thereafter to generate said feedback clock, wherein said first phase detector, said first low-pass filter, said first oscillator and said first feedback divider together operate as a first PLL having a first bandwidth, wherein said first oscillator is implemented as a second PLL with a second bandwidth higher in magnitude compared to said first bandwidth, wherein said filtered error signal is provided as input signal to said second PLL and said second PLL provides said output clock, wherein said first bandwidth is designed to cause said PLL to settle to said different frequency in a first duration upon a corresponding configuration change of only said first PLL; and a control unit to control operation of said first PLL and said second PLL, wherein to switch to said different frequency of said output clock, said control unit changes, within an interval less than said first duration, a configuration of each of said first PLL and said second PLL to generate said output clock at said different frequency, wherein changing said configuration of said first PLL comprises operating said first feedback divider based on said another divisor and/or changing said frequency of said input clock to effectively provide said output clock with said different frequency, wherein said output clock changes to operate at said different frequency in a second duration determined by said interval and the higher second bandwidth of said second PLL.

9. The system of claim 8, wherein said second PLL comprises:

a third oscillator to generate a second input clock with a first frequency;

a second phase detector to receive said second input clock divided by an integer greater than or equal to one, on a corresponding input path and a second feedback clock on a second feedback path, said phase detector to generate a second error signal representing a second phase difference between said second input clock and said second feedback clock;

a second low pass filter with a second passband to generate a second filtered error signal by filtering said second error signal, wherein magnitude of said second passband is higher than that of said first passband;

a second oscillator to generate said output clock from said second filtered error signal;

a second feedback divider to divide said output clock by a second divisor to generate said second feedback clock, wherein said changing configuration of said second PLL comprises changing said second divisor to a new value corresponding to said different frequency.

10. The system of claim 9, wherein said second divisor is a sum of said filtered error signal and a third divisor, wherein a user provided value for said third divisor causes said new value to be generated as said sum.

11. The system of claim 9, wherein said second PLL comprises:

a second pre-scaler to divide a third input clock by a pre-scaler divisor to generate a second input clock.

12. The system of claim 9, wherein said changing configuration of said second PLL further comprises forcing a voltage input to another new value corresponding to said different frequency, wherein said voltage input represents said second error signal.

13. The system of claim 9, wherein said second oscillator is implemented as a third PLL with a third bandwidth higher in magnitude compared to said second bandwidth, wherein said second PLL comprises a second low-pass-filter with a second passband to generate a second filtered error signal by filtering said second error signal, wherein said second oscillator generates said output clock based on said second filtered error signal, wherein said second filtered error signal is provided as an input signal to said third PLL and said third PLL provides said output clock, wherein to switch to said different frequency of said output clock, said control unit changes a configuration of each of said first PLL, said second PLL and said third PLL substantially simultaneously to generate said output clock at said different frequency.

14. The system of claim 8, wherein configurations of both said first PLL and said second PLL are changed simultaneously or with a slight time gap to correspondingly reduce said second duration.

* * * * *